(12) United States Patent
Komori et al.

(10) Patent No.: US 8,980,680 B2
(45) Date of Patent: Mar. 17, 2015

(54) METHOD FOR FABRICATING SOLAR CELL ELEMENT

(71) Applicant: Panasonic Corporation, Osaka (JP)

(72) Inventors: Tomoyuki Komori, Osaka (JP); Tetsuya Asano, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/104,763

(22) Filed: Dec. 12, 2013

(65) Prior Publication Data
US 2014/0106499 A1 Apr. 17, 2014

Related U.S. Application Data

(63) Continuation of application No. PCT/JP2012/003539, filed on May 30, 2012.

(60) Provisional application No. 61/562,053, filed on Nov. 21, 2011.

(51) Int. Cl.
H01L 21/00 (2006.01)
H01L 31/18 (2006.01)
C25D 3/22 (2006.01)
(Continued)

(52) U.S. Cl.
CPC ...... *H01L 31/18* (2013.01); *C25D 3/22* (2013.01); *C25D 3/565* (2013.01); *C25D 5/50* (2013.01); *H01L 31/022483* (2013.01); *H01L 31/0304* (2013.01); *H01L 31/0524* (2013.01); *H01L 31/0693* (2013.01); *C25D 7/12* (2013.01); *H01L 31/0336* (2013.01); *Y02E 10/52* (2013.01); *Y02E 10/544* (2013.01)
USPC .............. 438/94; 438/98; 438/608; 438/609

(58) Field of Classification Search
CPC ....... H01L 31/18; H01L 31/0336; C25D 3/22
USPC ................ 438/94, 95, 98, 608–609
See application file for complete search history.

(56) References Cited

U.S. PATENT DOCUMENTS 5,804,466 A 9/1998 Arao et al.
2010/0200060 A1 8/2010 Liu

FOREIGN PATENT DOCUMENTS

EP 0794270 A1 9/1997

OTHER PUBLICATIONS

Elias et al. ('Effect of the Chemical Nature of the Anions on the Electrodeposition of ZnO Nanowire Arrays'—2008), J. Phys. Chem. C 2008, 112, 5736-5741.*

(Continued)

*Primary Examiner* — Reema Patel
*Assistant Examiner* — Syed Gheyas
(74) *Attorney, Agent, or Firm* — McDermott Will & Emery LLP

(57) ABSTRACT

A method for fabricating a solar cell element, the method comprising a step (a) of preparing a laminate and a chamber, a step (b) of bringing the laminate into contact with the aqueous solution in such a manner that the second surface is immersed in the aqueous solution after the step (a); a step (c) of applying a voltage difference between an anode electrode and the laminate under an atmosphere of the inert gas to form a Zn layer on the second surface after the step (b); and a step (d) of exposing the Zn layer to oxygen so as to convert the Zn layer into a ZnO crystalline layer after the step (c).

8 Claims, 16 Drawing Sheets

(51) Int. Cl.
*C25D 3/56* (2006.01)
*C25D 5/50* (2006.01)
*H01L 31/0224* (2006.01)
*H01L 31/0304* (2006.01)
*H01L 31/052* (2014.01)
*H01L 31/0693* (2012.01)
*C25D 7/12* (2006.01)
*H01L 31/0336* (2006.01)

(56) References Cited

OTHER PUBLICATIONS

Yun et al., "Deposition and Characterization of TCO Films for the Application in GaAs Solar Cells," Conference Record of the 2006 IEEE 4th World Conference on Photovoltaic Energy Conversion, IEEE, May 7-12, 2006, pp. 823-825.

Zou et al., "Orientation enhancement of polycrystalline ZnO thin films through termal oxidation of electrodeposited zinc metal," Materials Letters, ScienceDirect, vol. 61, No. 21, Feb. 6, 2007, pp. 4305-4308.

Su et al., "Antireflective and Radiation Resistant ZnO Thin Films for the Efficiency Enhancement of GaAs Photovoltaics," Journal of the Electrochemical Society, vol. 158, No. 3, Jan. 7, 2011, pp. H267-H270.

Lee et al., "Thin Film GaAs Solar Cells on Glass Substrates by Epitaxial Liftoff," 25th PVSC, IEEE, May 13-17, 1996, pp. 53-55.

P.N. Vinod, "Specific contact resistance measurements of the screen-printed Ag thick film contacts in the silicon solar cells by three-point probe methodology and TLM method," J Mater Sci: Mater Electron, (2011) 22:1248-1257.

J. Nelson, "The Physics of Solar Cells," Imperial College Press (2003), pp. 11-13.

International Search Report issued in International Application No. PCT/JP2012/003539 mailed Jun. 3, 2013, 3 pgs.

\* cited by examiner

| Isc  | 6.33E-5 A   |
|------|-------------|
| Jsc  | 25.3 mA/cm2 |
| Voc  | 0.97 V      |
| Vmax | 0.86V       |
| Imax | 5.96E-05 A  |
| FF   | 83.50%      |

| Isc | 6.23E-05 A |
| --- | --- |
| Jsc | 24.9 mA/cm2 |
| Voc | 0.97 V |
| Vpm | 0.85V |
| Ipm | 6.04E-05 A |
| FF | 84.9% |

Isc 6.19E-05 A
Jsc 24.8 mA/cm2
Voc 0.97 V
Vpm 0.85V
Ipm 6.01E-05 A
FF 85.0%

| | |
|---|---|
| Isc | 6.02E-05 A |
| Jsc | 24.1 mA/cm2 |
| Voc | 0.98 V |
| Vpm | 0.85V |
| Ipm | 5.84E-05 A |
| FF | 84.1% |

| | |
|---|---|
| Isc | 5.17E-05 A |
| Jsc | 20.7 mA/cm2 |
| Voc | 0.98 V |
| Vpm | 0.83V |
| Ipm | 5.01E-05 A |
| FF | 82.7% |

| | |
|---|---|
| Isc | 5.03E-05 A |
| Jsc | 20.1 mA/cm2 |
| Voc | 0.98 V |
| Vpm | 0.84V |
| Ipm | 4.88E-05 A |
| FF | 83.4% |

| | |
|---|---|
| Isc | 5.60E-05 A |
| Jsc | 22.4 mA/cm2 |
| Voc | 0.98 V |
| Vpm | 0.82 V |
| Ipm | 5.44E-05 A |
| FF | 81.8% |

METHOD FOR FABRICATING SOLAR CELL ELEMENT

This is a continuation of International Application No. PCT/JP2012/003539, with an international filing date of May 30, 2012, which claims priority of U.S. Provisional Patent Application No. 61/562,053 filed on Nov. 21, 2011, the contents of which are hereby incorporated by reference.

TECHNICAL FIELD

The present disclosure relates to a method for fabricating a solar cell element.

BACKGROUND ART

A solar cell element converts sunlight into electrical energy.

CITATION LIST

Non Patent Literature

NPL 1: P. N. Vinod, J Mater Sci: Mater Electron 22 (2011) 1248
NPL 2: Jenny Nelson (2003), The physics of Solar Cells, Imperial college press, pp. 11-13.

SUMMARY OF INVENTION

Technical Problem

The purpose of the present disclosure is to provide a method for fabricating a solar cell element having higher conversion efficiency.

Solution to Problem

The following items 1 to 3 solve the problem.
1. A method for fabricating a solar cell element, the method comprising:
   a step (a) of preparing a laminate 1 and a chamber 5, wherein
      the laminate 1 comprises a p-side group-III-group-V compound electrode layer 2, a p-type group-III group-V compound semiconductor layer 31, an n-type group-III-group-V compound semiconductor layer 32, and an n-side group-III-group-V compound electrode layer 4,
      the n-side group-III-group-V compound electrode layer 4 comprises a first surface 4a and a second surface 4b,
      the p-type group-III-group-V compound semiconductor layer 31 is interposed between the p-side group-III-group-V compound electrode layer 2 and the n-type group-III-group-V compound semiconductor layer 32,
      the n-type group-III-group-V compound semiconductor layer 32 is interposed between the p-type group-III-group-V compound semiconductor layer 31 and the first surface 4a,
      the second surface 4b is exposed on the surface of the laminate 1, and
      the chamber 5 has an aqueous solution 6 and an inert gas 7;
   a step (b) of bringing the laminate 1 into contact with the aqueous solution 6 in such a manner that the second surface 4b is immersed in the aqueous solution 6 after the step (a);
   a step (c) of applying a voltage difference between an anode electrode 71 and the laminate 1 under an atmosphere of the inert gas 7 to form a Zn layer 81 on the second surface 4b after the step (b), wherein
      the chamber 5 is filled with the inert gas 7,
      the aqueous solution 6 contains $Zn^{2+}$ ions having a concentration of not less than 1 mM and not more than 5 M,
      the aqueous solution 6 contains no oxygen,
      the anode electrode 71 is contact with the aqueous solution 6,
      the laminate 1 is used as a cathode electrode,
      the aqueous solution 6 has a temperature of not less than 10 degrees Celsius and not more than 60 degrees Celsius, and
      the Zn layer 81 has a concave-convex structure on the surface thereof; and
   a step (d) of exposing the Zn layer 81 to oxygen so as to convert the Zn layer 81 into a ZnO crystalline layer 82 after the step (c).
2. The method according to the item 1, wherein
   in the step (d), the Zn layer 81 is exposed to air.
3. The method according to the item 1, wherein
   in the step (a), the n-side group-III-group-V compound electrode layer 4 comprises a GaAs layer 42, and
   the GaAs layer 42 is exposed on the second surface 4b.

Advantageous Effects of Invention

The solar cell element provided according to the present method has higher conversion efficiency.

In other words, when a solar cell element 101 provided according to the method is irradiated with sunlight, the sunlight is converted into electrical energy more efficiently to generate a voltage difference between the p-side group-III-group-V compound electrode layer 2 and the n-side group-III-group-V compound electrode layer 4.

DESCRIPTION OF EMBODIMENTS

Figure 1:
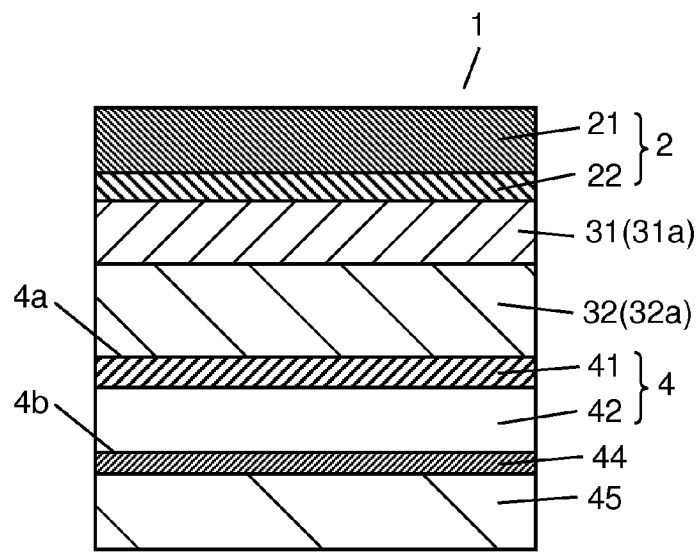
FIG. 1 shows a cross-sectional view of the laminate 1.

The embodiment of the present disclosure will be described below with reference to the drawings.

(Step (a)): Preparation of Laminate and Chamber

In the step (a), a laminate 1 and a chamber 5 are prepared first.

As shown in FIG. 1 to FIG. 6, the laminate 1 comprises a p-side group-II-group-V compound electrode layer 2, a p-type group-III-group-V compound semiconductor layer 31, an n-type group-III-group-V compound semiconductor layer 32, and an n-side group-III-group-V compound electrode layer 4. The n-side group-III-group-V compound electrode layer 4 comprises a first surface 4a and a second surface 4b.

The p-type group-III-group-V compound semiconductor layer 31 is interposed between the p-side group-III-group-V compound electrode layer 2 and the n-type group-III-group-V compound semiconductor layer 32.

The n-type group-III-group-V compound semiconductor layer 32 is interposed between the first surface 4a and the p-type group-III-group-V compound semiconductor layer 31.

Figure 6:
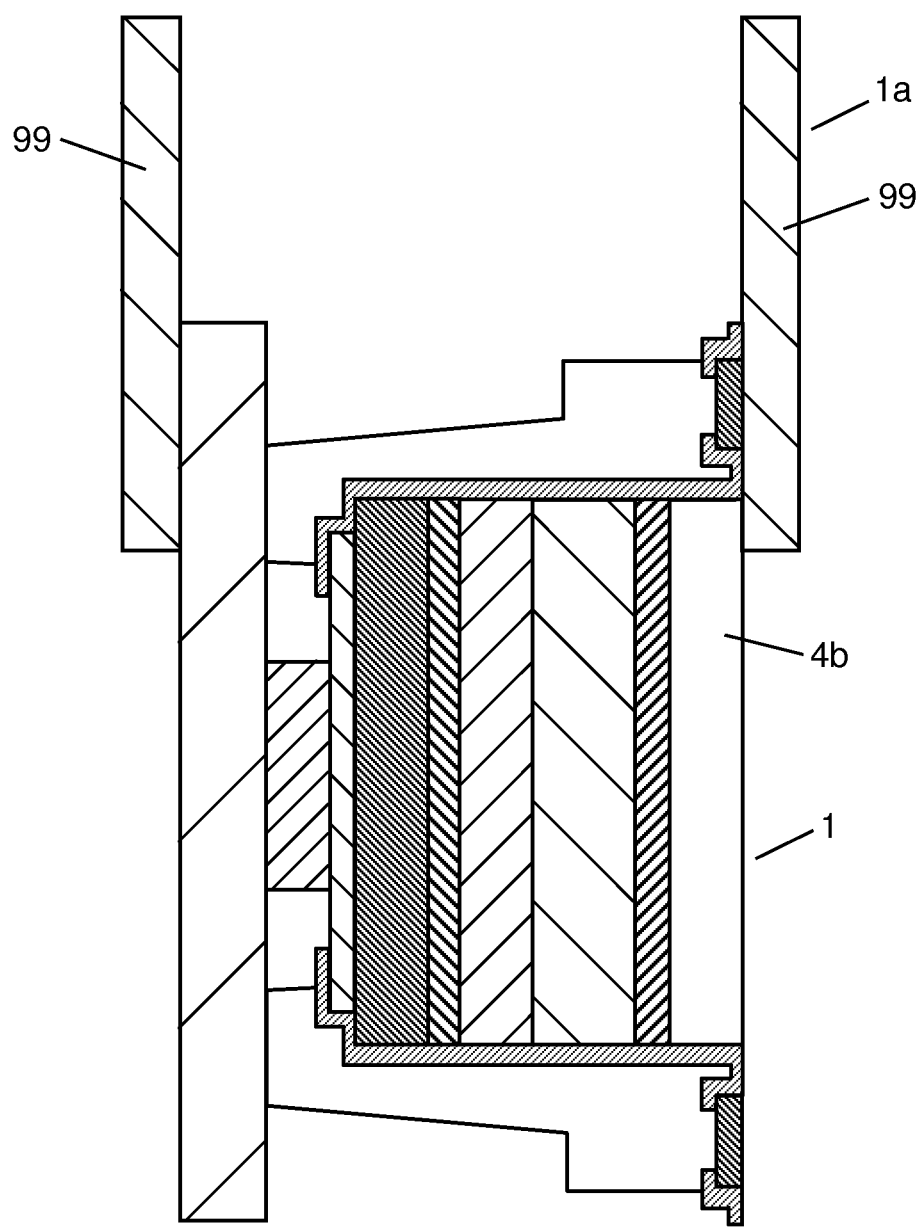
FIG. 6 shows a cross-sectional view of the laminate 1 in the step (a) subsequent to FIG. 5.

As shown in FIG. 6, the second surface 4b is exposed on the surface of laminate 1.

The p-side group-III-group-V compound electrode layer 2 generally comprises a p-side contact layer 21 and a p-side window layer 22.

The p-type group-III-group-V compound semiconductor layer 31 generally comprises a p-type base layer 31a consisting of a p-type GaAs layer.

The n-type group-III-group-V compound semiconductor layer 32 generally comprises an n-type emitter layer 32a consisting of an n-type GaAs layer.

The n-side group-III-group-V compound electrode layer 4 generally comprises an n-side window layer 41 and an n-side contact layer 42.

The p-type group-III-group-V compound semiconductor layer 31 is in contact with the n-type group-III-group-V compound semiconductor layer 32 to form a pn-junction.

The method for preparing the laminate 1 is not limited. For more detail, see FIG. 1-FIG. 6 and the example 1.

Figure 7:
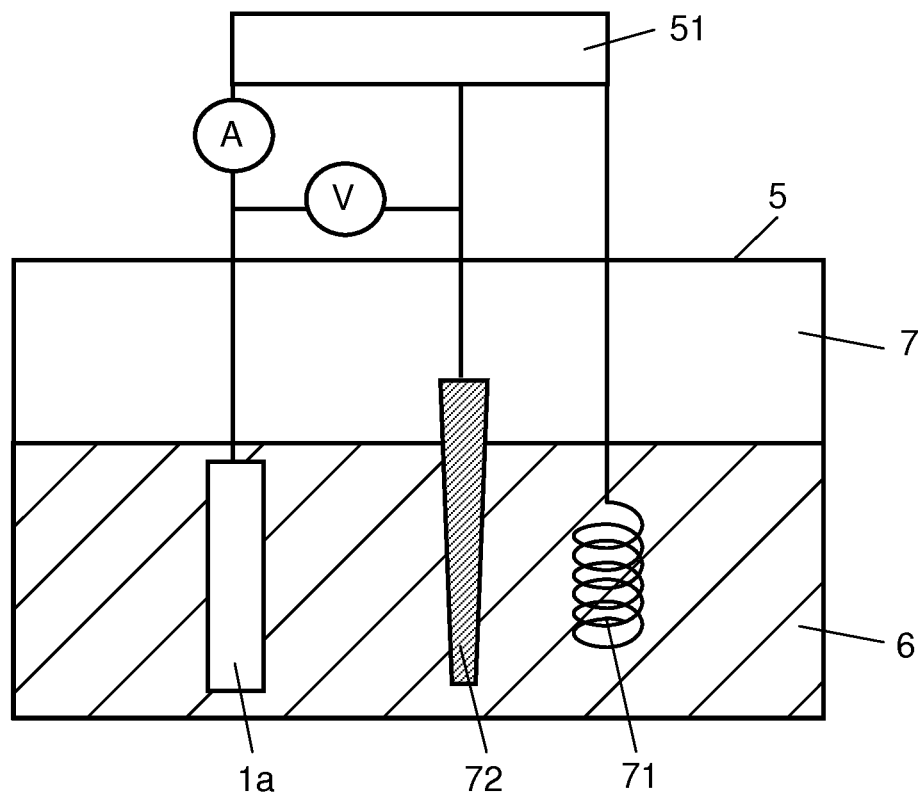
FIG. 7 shows the steps (b) and (c) schematically.

As shown in FIG. 7, a chamber 5 contains an aqueous solution 6 and an inert gas 7.

(Step (b)): Contact of Laminate into Aqueous Solution

The step (b) is performed after the step (a).

In the step (b), the laminate 1 is brought into contact with the aqueous solution 6 in such a manner that the second surface 4b is immersed in the aqueous solution 6. The n-side contact layer 42 consisting of GaAs is exposed on the second surface 4b.

As shown in FIG. 7, it is preferable that the laminate 1 is immersed in the aqueous solution 6. However, as long as the second surface 4b is immersed in the aqueous solution 6, a part of the laminate 1 may be immersed in the aqueous solution 6 and the other part of the laminate 1 may be not immersed in the aqueous solution 6.

(Step (c)): Formation of Zn Layer by Electrolysis

The step (c) is performed after the step (b).

In the step (c), as shown in FIG. 7, a voltage difference is applied between the anode electrode 71 and the laminate 1 to form a Zn layer 81 on the second surface 4b. The laminate 1 is used as a cathode electrode.

The anode electrode 71 is in contact with the aqueous solution 6. It is preferable that the anode electrode 71 is immersed in the aqueous solution 6. An example of the anode electrode 71 is a platinum electrode, a gold electrode, a silver electrode, or a copper electrode. A platinum electrode and a gold electrode are preferred.

In the step (c), it is necessary that the aqueous solution 6 contains $Zn^{2+}$ ions having a concentration of not less than 1 mM and not more than 5M. When the concentration is less than 1 mM, the Zn layer 81 is not formed efficiently. When the concentration is greater than 5 M, the efficiency of the obtained solar cell element is low, as demonstrated in the comparative example 1, which is described later.

It is necessary that the aqueous solution 6 has a temperature of not less than 10 degrees Celsius and not more than 60 degrees Celsius. When the temperature of the aqueous solution 6 is higher than 60 degrees Celsius, the conversion efficiency of the obtained solar cell element is low, as demonstrated in the comparative example 2, which is described later. When the temperature of the aqueous solution 6 is less than 10 degrees Celsius, an excessively long time is required to form the Zn layer 81.

It is necessary that the chamber 5 is filled with the inert gas 7. To be more exact, the chamber 5 is filled with the inert gas 7 except in the part occupied by the aqueous solution 6. In other words, the lower part of the chamber 5 is occupied by the aqueous solution 6, and the upper part of the chamber 5 is occupied by the inert gas 7. An example of the inert gas 7 is nitrogen gas, helium gas, neon gas, argon gas, krypton gas, or xenon gas.

When the chamber 5 is not filled with the inert gas 7, the conversion efficiency of the obtained solar cell element is low, as demonstrated in the comparative example 3, which is described later. Accordingly, the aqueous solution 6 is required not to contain oxygen.

Figure 8:
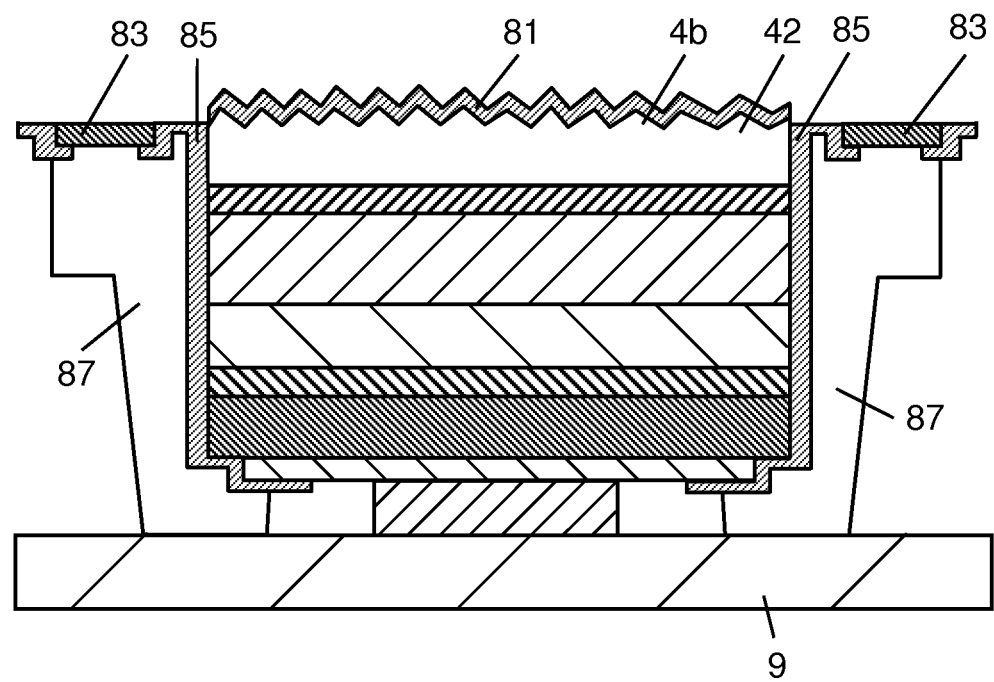
FIG. 8 shows a cross-sectional view of the laminate 1 after the step (c).

As shown in FIG. 8, the Zn layer 81 thus obtained has a concave-convex structure on the surface thereof.

As shown in FIG. 7, the chamber 5 may comprise a reference electrode 72 which is in contact with the aqueous solution 6. An example of the reference electrode 72 is an Ag/AgCl electrode.

(Step (d)): Conversion of Zn Layer into ZnO Crystalline Layer by Oxygen Contact

The step (d) is performed after the step (c).

In the step (d), as shown in FIG. 8, the Zn layer 81 is brought into contact with oxygen gas to convert the Zn layer 81 into a ZnO crystalline layer 82. Preferably, the Zn layer 81 is brought into contact with air.

The entire Zn layer 81 may be converted into the ZnO crystalline layer 82. Instead of this, a part of the Zn layer 81 may be converted into the ZnO crystalline layer 82.

Figure 10:
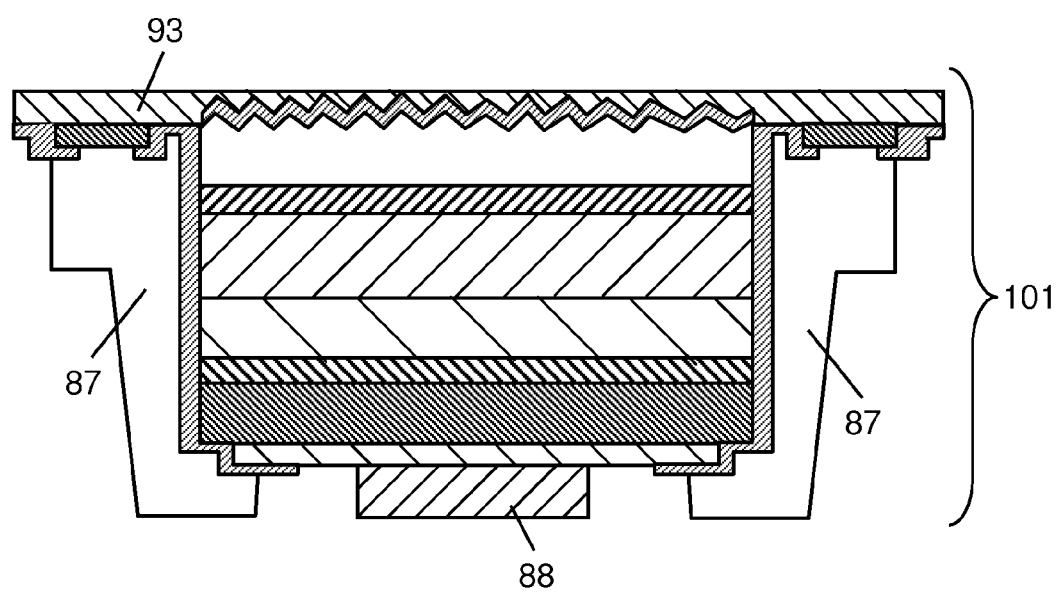
FIG. 10 shows a cross-sectional view of the laminate 1 having a ZnO transparent electrode layer 93.

As shown in FIG. 10, a ZnO transparent electrode layer 93 may be formed on the ZnO crystalline layer 82 by a pulse laser deposition method. In this way, the ZnO crystalline layer 82 is electrically connected to an obverse electrode 83.

EXAMPLE

The following example describes the present disclosure in more detail.

Example 1

As shown in FIG. 1, a laminate was prepared as below.

First, a AlAs sacrifice layer 44 having a thickness of 100 nanometers was formed on a non-doped GaAs substrate 45 having a diameter of 4 inches and a thickness of 450 micrometers by a metal organic chemical vapor deposition method (hereinafter, referred to as an "MOCVD").

Then, the laminate 1 was formed on the AlAs sacrifice layer 44 as below.

More particularly, an n-side contact layer 42 consisting of a Te-doped GaAs layer (dope concentration: $1.0 \times 10^{19}$, thickness: 20 nanometers) was formed on the AlAs sacrifice layer 44 by an MOCVD method.

Next, an n-side window layer 41 consisting of a Si-doped InGaP layer (dope concentration: $1.0 \times 10^{18}$, thickness: 100 nanometers) was formed on the n-side contact layer 42 by an MOCVD method.

An n-type emitter layer 32a consisting of a Si-doped GaAs (dope concentration: $1.0 \times 10^{18}$, thickness: 100 nanometers) was formed on the n-side window layer 41 by an MOCVD method.

A p-type base layer 31a consisting of a Zn-doped GaAs (dope concentration: $1.0 \times 10^{16}$, thickness: 2.5 micrometers) was formed on the n-type emitter layer 32a by an MOCVD method.

A p-side window layer 22 consisting of a Zn-doped InGaP layer (dope concentration: $1.0 \times 10^{19}$, thickness: 50 nanometers) was formed on the p-type base layer 31 by an MOCVD method.

A p-side contact layer 21 consisting of a Zn-doped GaAs layer (dope concentration: $1.0 \times 10^{19}$, thickness: 20 nanometers) was formed on the p-side window layer 22 by an MOCVD method.

In this way, the laminate 1 shown in FIG. 1 was obtained.

Figure 2:
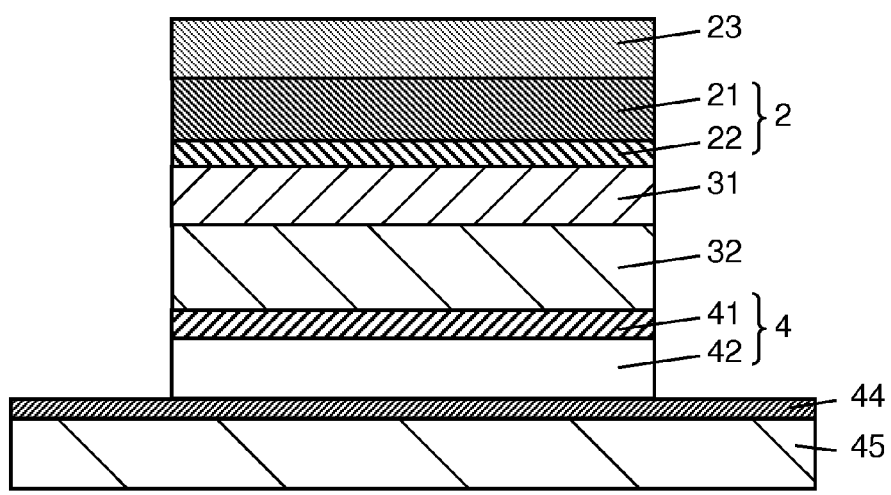
FIG. 2 shows a cross-sectional view of the laminate 1 in the step (a).
Figure 3:
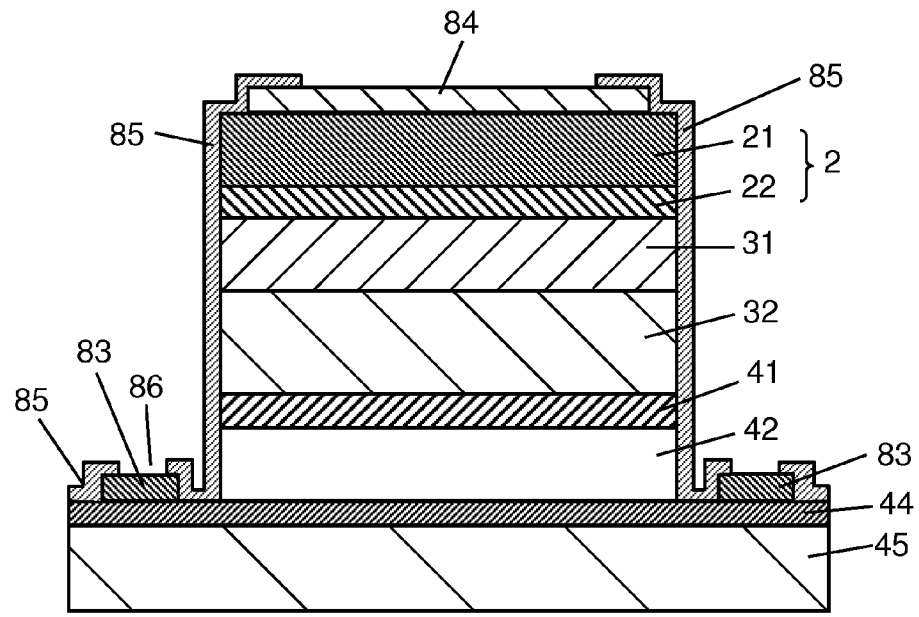
FIG. 3 shows a cross-sectional view of the laminate 1 in the step (a) subsequent to FIG. 2.

Then, as shown in FIG. 2, a resist film 23 of 500 micrometers square was formed on the p-side contact layer 21 by photolithography. An unnecessary part of the laminate 1 was removed by an ICP plasma etching method using this resist film 23 as a first mask. In this ICP plasma etching method, a gas mixture of $BCl_3$ and $SF_6$ was used. The surface area of the laminate 1 was 25,000 square micrometers.

Subsequently, the resist film was removed with a peeling liquid. After another resist film (not illustrated) was formed on the AlAs sacrifice layer 44, a titanium film having a thickness of 50 nanometers and a gold film having a thickness of 250 nanometers were formed on the AlAs sacrifice layer 44 by an electron beam vacuum deposition method so as to form an obverse electrode 83.

Similarly, after another resist film (not illustrated) was formed on the p-side contact layer 21, a titanium film having a thickness of 50 nanometers and a gold film having a thickness of 250 nanometers were formed on the p-side contact layer 21 by an electron beam vacuum deposition method to form a reverse electrode 84.

These another resist films were removed. Subsequently, an isolation film 85 was formed on the side walls of the obverse electrode 83, the reverse electrode 84, and the laminate 1. This isolation film 85 was formed of an SiN film having a thickness of 300 nanometers. A resist film was formed and a dry-etching was performed so as to form an opening 86 in the isolation film 85. Thus, the laminate 1 shown in FIG. 3 was obtained.

Figure 4:
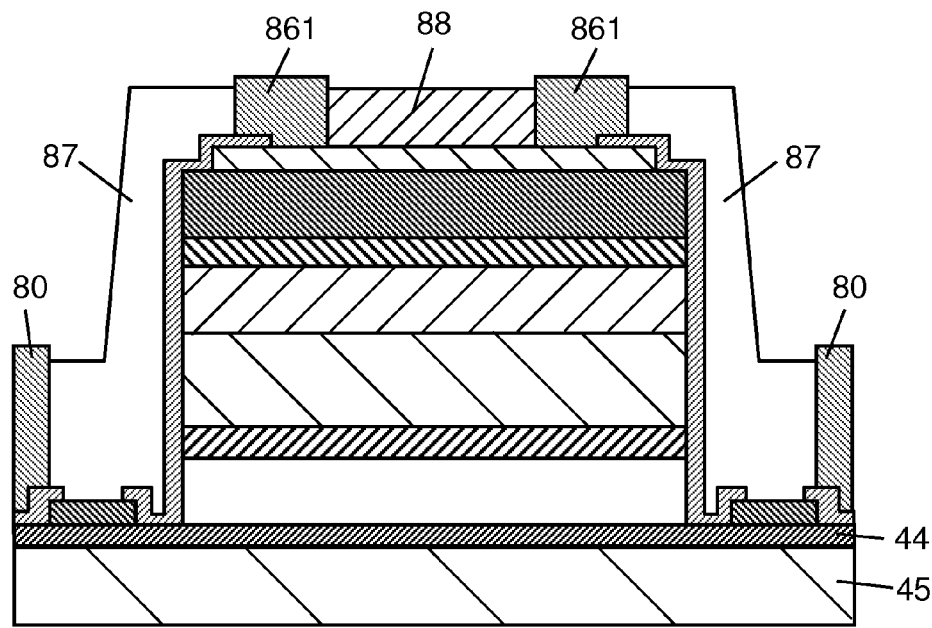
FIG. 4 shows a cross-sectional view of the laminate 1 in the step (a) subsequent to FIG. 3.

As shown in FIG. 4, a second mask 861 was formed on the isolation film 85 by photolithography. Subsequently, a titanium film having a thickness of 50 nanometers and a gold film having a thickness of 250 nanometers were formed on the side wall of the laminate 1 by an electron beam vacuum deposition method to form an obverse electrode wiring part 87 and a reverse electrode wiring part 88.

Figure 5:
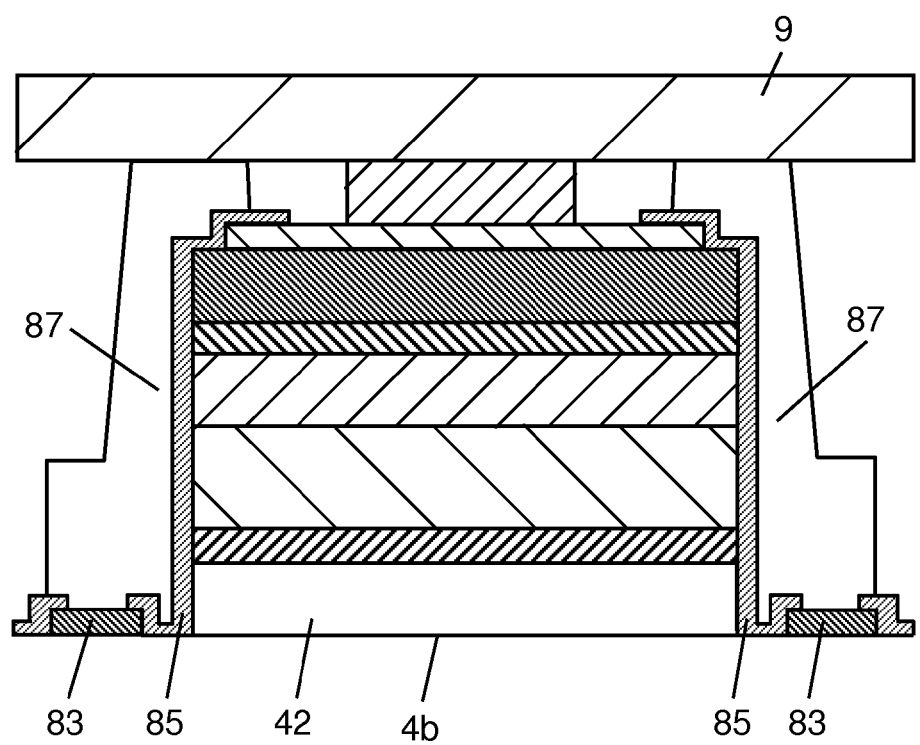
FIG. 5 shows a cross-sectional view of the laminate 1 in the step (a) subsequent to FIG. 4.

As shown in FIG. 5, the second mask 861 was removed. Wax was applied to the surfaces of the obverse electrode wiring part 87 and the reverse electrode wiring part 88 by a spin-coater method. After the wax was dried, a supporting substrate 9 was fixed on the wax. The AlAs sacrifice layer 44 was removed by wet etching using hydrofluoric acid to expose the n-side contact layer 42 on the bottom of laminate 1.

As shown in FIG. 6, the laminate 1 thus obtained was bound with a clip 99. In this way, a cathode electrode 1a having the laminate 1 was obtained.

As shown in FIG. 7, the cathode electrode 1a having the laminate 1, an anode electrode 71 consisting of a platinum electrode, and a reference electrode 72 consisting of an Ag/AgCl electrode were set in the chamber 5. These electrodes were set in the chamber 5 in such a manner that these electrodes were immersed in the aqueous solution 6.

The aqueous solution 6 was prepared as below beforehand. Bubbles of $N_2$ gas were supplied to a $Zn(NO_3)_2$ aqueous solution having a concentration of 1 mM at a temperature of 10 degrees Celsius for one hour. In this way, the oxygen which had been contained in the aqueous solution was removed to obtain the aqueous solution 6.

The chamber 5 was filled beforehand with $N_2$ gas.

Then, using a potentiostat 51, a voltage difference of 0.8 V was applied between the cathode electrode 1a and the anode electrode 71 for three minutes to form the Zn layer 81 on the surface (the second surface 4b) of the n-side contact layer 42. The temperature of the aqueous solution 6 was 10 degrees Celsius.

The cathode electrode 1a was taken out from the chamber 5. The cathode electrode 1a was washed for five minutes with ion-exchange water. Then, the cathode electrode 1a was exposed to $N_2$ blow to dry the cathode electrode 1a. In this way, the Zn layer 81 having a concave-convex structure on the surface thereof was obtained.

Figure 9:
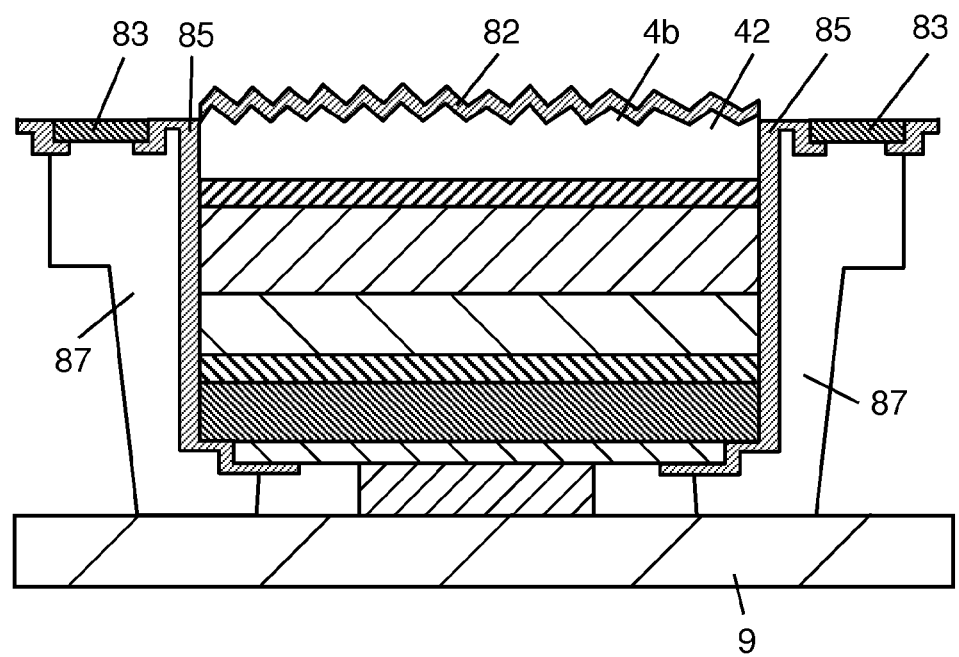
FIG. 9 shows the step (d) schematically.

The laminate 1 comprising the Zn layer 81 was exposed to atmospheric air for two days. In this way, as shown in FIG. 9, the Zn layer 81 was converted into the ZnO crystalline layer 82. In more detail, the entire Zn layer 81 was converted into the ZnO crystalline layer 82.

Finally, as shown in FIG. 10, a ZnO transparent electrode layer 93 was formed on the ZnO crystalline layer 82 by a pulsed laser deposition to connect the ZnO crystalline layer 82 to the obverse electrode 83 electrically. The ZnO transparent electrode layer 93 had a thickness of 300 nanometers. The ZnO transparent electrode layer 93 had a gallium concentration of 2% by weight.

In this way, the solar cell element 101 was obtained.

Figure 11:
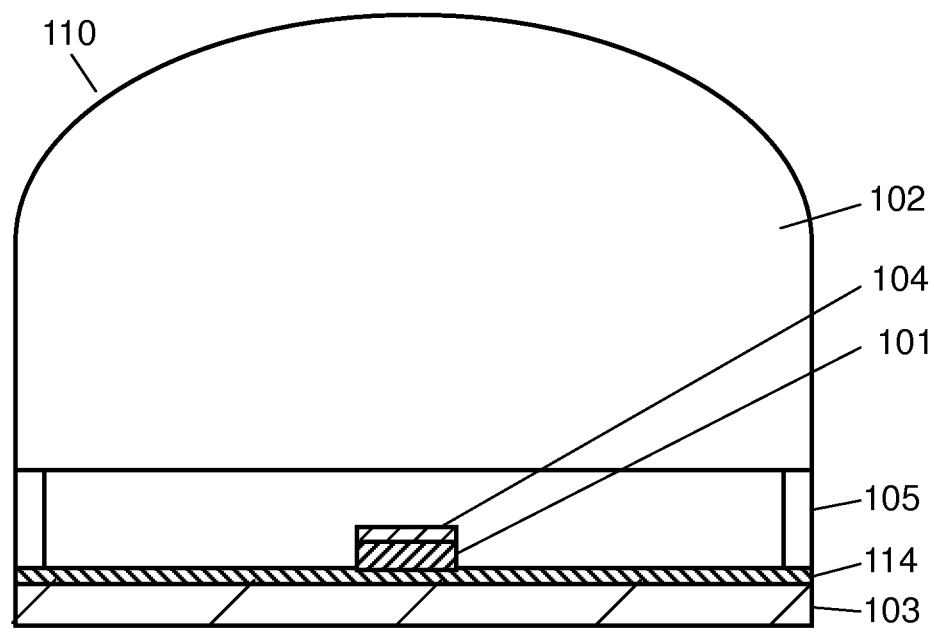
FIG. 11 shows a solar cell 110 comprising the solar cell element 101.

As shown in FIG. 11, the obtained solar cell element 101 was joined with a condenser lens 102 to form a solar cell 110.

In more detail, an anti-reflection coating 104 consisting of a $MgF_2$ film having a thickness of 140 nanometers was formed on the ZnO transparent electrode layer 93 by an electron beam vacuum deposition method.

As shown in FIG. 11, the solar cell element 101 was set on a cold plate 103 comprising an insulating layer 114 and a spacer 105 on the surface thereof. Two electric wirings (not illustrated) electrically connected to the obverse electrode 83 and the reverse electrode 84 were formed on the insulating layer 114.

The solar cell element 101 was fixed at the focal point of the condenser lens 102 to obtain the solar cell 110.

The interface resistance value of the obtained solar cell 110 was measured in accordance with a TLM method, which was disclosed in Non-Patent Literature 1. During the measurement, the condenser lens 102 was irradiated with pseudo-sunlight, which was described later.

The conversion efficiency of the obtained solar cell 110 was calculated as below.

The condenser lens 102 was irradiated with a pseudo-sunlight having an output energy of 100 mW/cm$^2$.

The pseudo-sunlight was radiated from the lamp where a xenon lamp (available from Wacom Co., Ltd.) of 500 watts and a halogen lamp (available from Wacom Co., Ltd.) of 400 watts were combined together.

The open circuit voltage Voc was measured when the obverse electrode 83 and the reverse electrode 84 were electrically opened.

The short-circuit current Isc was measured when the obverse electrode 83 and the reverse electrode 84 were short-circuited.

Figure 12:
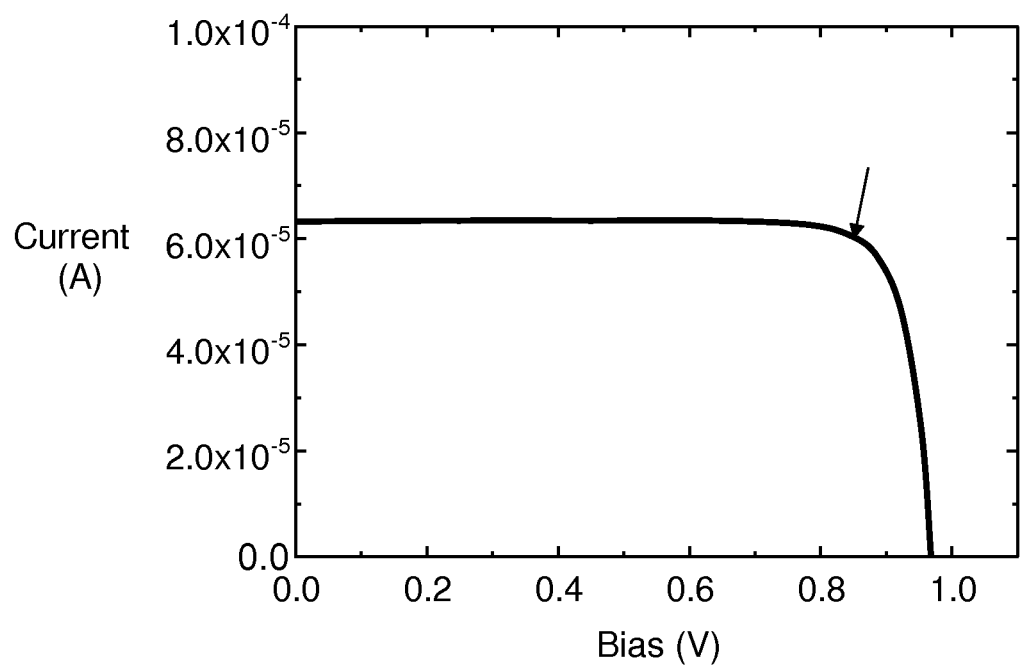
FIG. 12 shows the I-V curve obtained in the example 1.

An I-V curve line as shown in FIG. 12 was obtained using a solar simulator (available from Wacom Co., Ltd., Trade name: Super Solar simulator WXS-90S-L2).

On the basis of FIG. 12, the fill factor (hereinafter, referred to as "FF") was obtained in accordance with the disclosure of Non-Patent Literature 2.

The fill factor FF was calculated in accordance with the following formula.

$$FF = \frac{V_{max} \cdot I_{max}}{V_{oc} \cdot I_{sc}} \quad \text{[Formula 1]}$$

Here, Vmax means the voltage when the V·I value of the I-V curve is maximum (see the arrow in FIG. 12).

Imax means the electric current when the V·I value of the I-V curve is maximum (see the arrow in FIG. 12).

The conversion efficiency is calculated in accordance with the following formula.

Conversion efficiency=Voc·Jsc·FF

Here, Jsc=Isc/S

S (effective light-receiving surface area)=25,000 square micrometers.

The results are shown in Table 1.

Example 2

Figure 13:
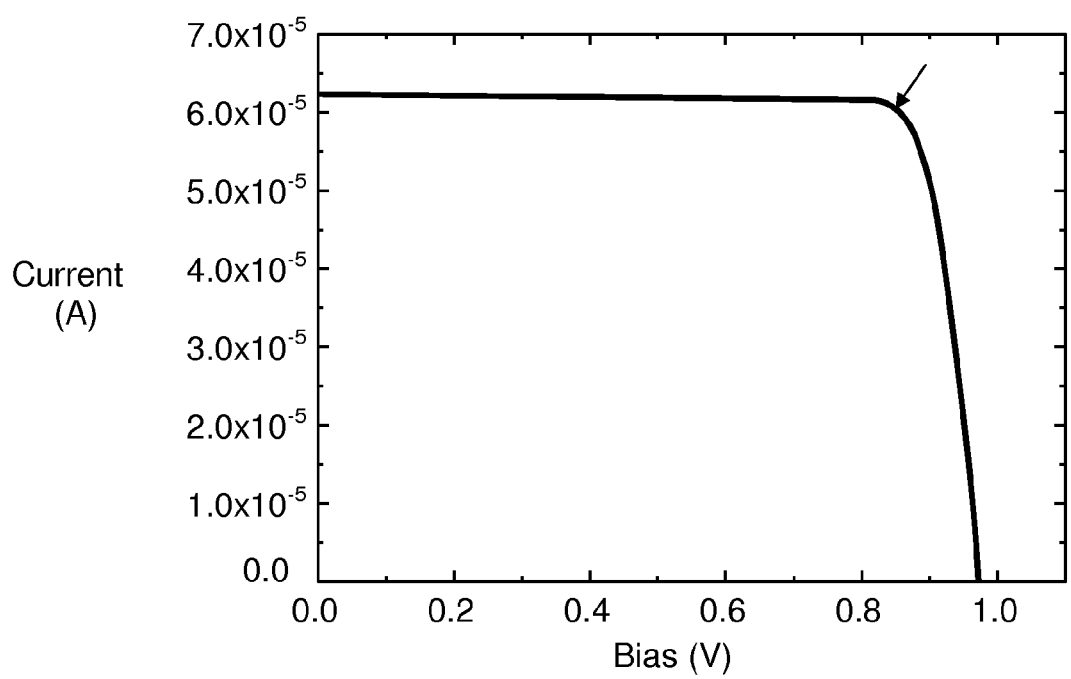
FIG. 13 shows the I-V curve obtained in the example 2.

An experiment similar to the example 1 was conducted except that the $Zn(NO_3)_2$ aqueous solution had a concentration of 5 M. The result is shown in FIG. 13 and Table 1.

Example 3

Figure 14:
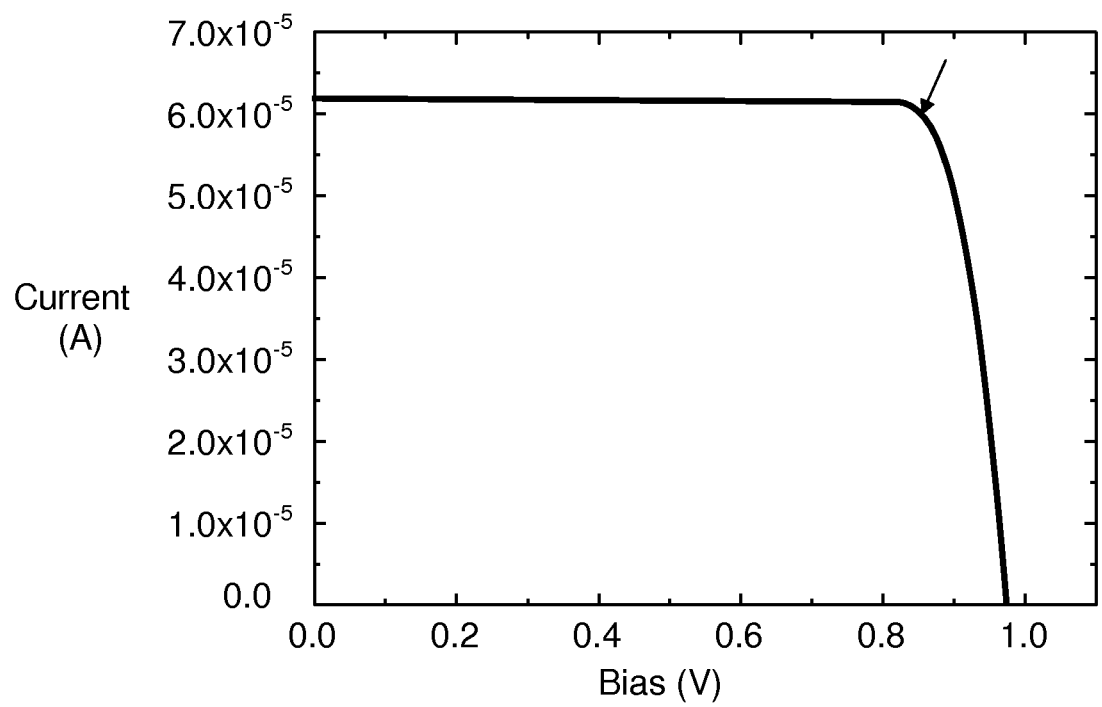
FIG. 14 shows the I-V curve obtained in the example 3.

An experiment similar to the example 1 was conducted except that the $Zn(NO_3)_2$ aqueous solution had a temperature of 60 degrees Celsius. The result is shown in FIG. 14 and Table 1.

Example 4

Figure 15:
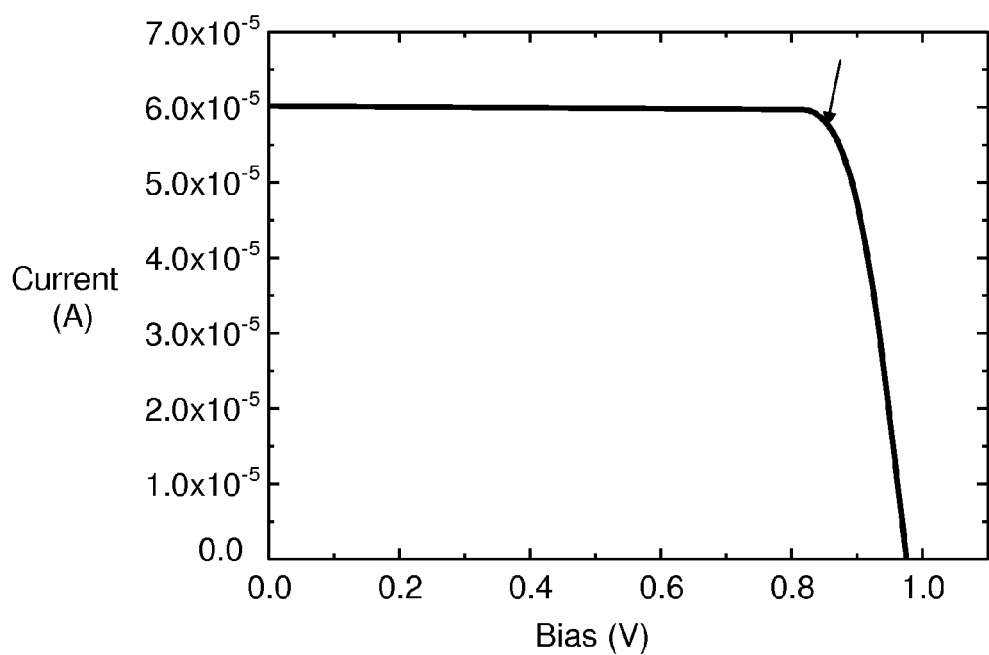
FIG. 15 shows the I-V curve obtained in the example 4.

An experiment similar to the example 1 was conducted except that the $Zn(NO_3)_2$ aqueous solution had a concentration of 5 M and a temperature of 60 degrees Celsius. The result is shown in FIG. 15 and Table 1.

Comparative Example 1

Figure 16:
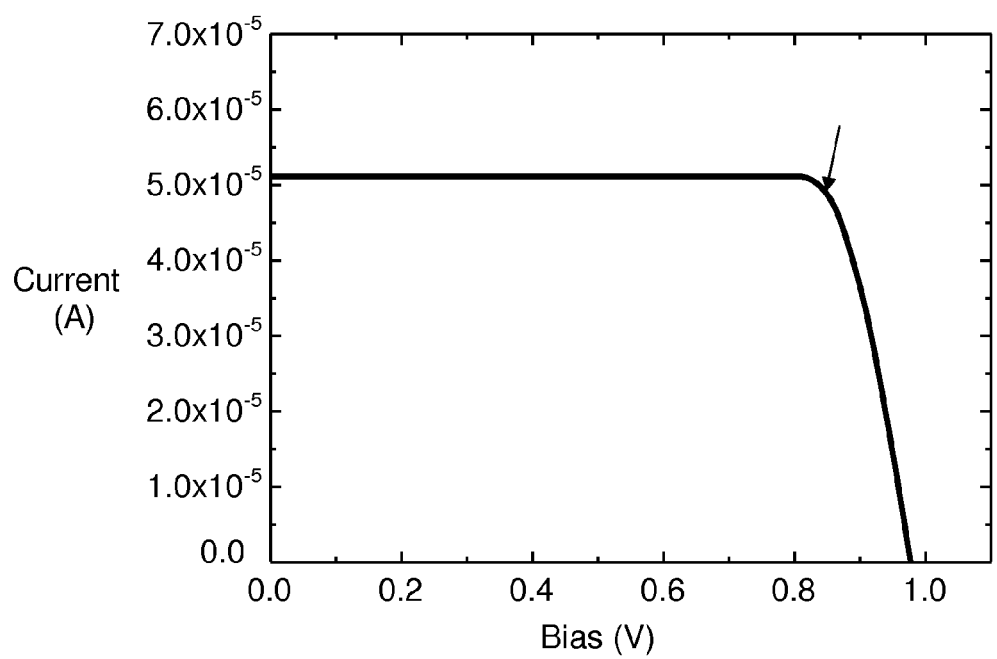
FIG. 16 shows the I-V curve obtained in the comparative example 1.

An experiment similar to the example 1 was conducted except that the $Zn(NO_3)_2$ aqueous solution had a concentration of 7 M and a temperature of 60 degrees Celsius. The result is shown in FIG. 16 and Table 1.

Comparative Example 2

Figure 17:
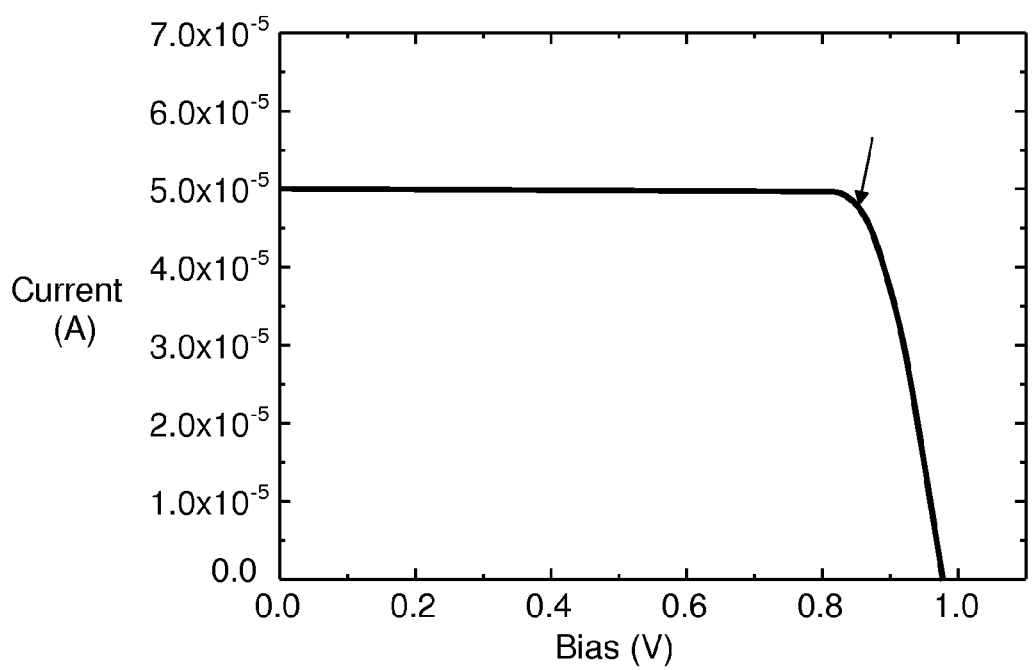
FIG. 17 shows the I-V curve obtained in the comparative example 2.

An experiment similar to the example 1 was conducted except that the $Zn(NO_3)_2$ aqueous solution had a temperature of 70 degrees Celsius. The result is shown in FIG. 17 and Table 1.

Comparative Example 3

Figure 18:
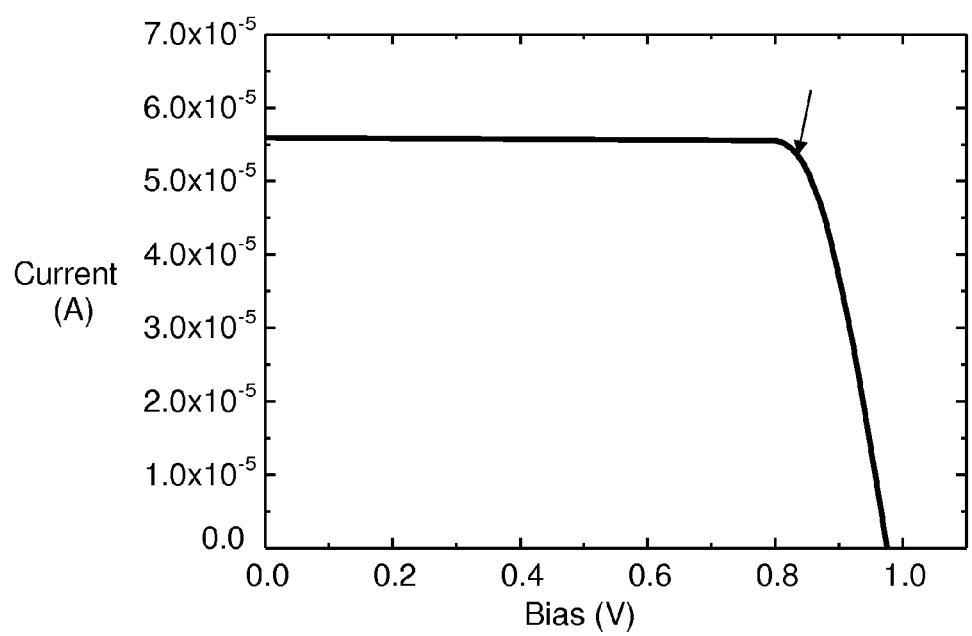
FIG. 18 shows the I-V curve obtained in the comparative example 3.

An experiment similar to the example 1 was conducted except that the chamber 5 was filled with atmospheric air. The result is shown in FIG. 18 and Table 1.

TABLE 1

| | Solution | Temperature [Celsius] | Atmosphere | Interface resistance [Ω cm] | Conversion efficiency [%] |
|---|---|---|---|---|---|
| Example 1 | 1 mM $Zn(NO_3)_2$ | 10 | $N_2$ | $6.0 \times 10^{-4}$ | 20.5 |
| Example 2 | 5M $Zn(NO_3)_2$ | 10 | $N_2$ | $5.7 \times 10^{-4}$ | 20.6 |
| Example 3 | 1 mM $Zn(NO_3)_2$ | 60 | $N_2$ | $5.4 \times 10^{-4}$ | 20.5 |
| Example 4 | 5M $Zn(NO_3)_2$ | 60 | $N_2$ | $6.2 \times 10^{-4}$ | 19.8 |
| Comparative example 1 | 7M $Zn(NO_3)_2$ | 20 | $N_2$ | $1.4 \times 10^{-3}$ | 16.7 |
| Comparative example 2 | 5M $Zn(NO_3)_2$ | 70 | $N_2$ | $1.0 \times 10^{-3}$ | 16.4 |
| Comparative example 3 | 1 mM $Zn(NO_3)_2$ | 10 | Air | $2.1 \times 10^{-3}$ | 17.9 |

As is clear from Table 1, in order to achieve higher efficiency, it is necessary that all of the following items (1) to (3) are satisfied when the Zn layer 81 is formed.

(1) The concentration of the $Zn^{2+}$ is not less than 1 mM and not more than 5 M (see the comparative example 1).

(2) The temperature of the aqueous solution is not less than 10 degrees Celsius and not more than 60 degrees Celsius (see the comparative example 2).

(3) The Zn layer 81 is formed under an atmosphere of inert gas (see the comparative example 3).

Industrial Applicability

The present disclosure provides a method for fabricating a solar cell element having higher conversion efficiency.

REFERENCE SIGNS LIST

1 laminate
2 p-side group-III-group-V compound electrode layer
21 p-side contact layer
22 p-side window layer
31 p-type group-III-group-V compound semiconductor layer
31*a* p-type base layer
32 n-type group-III-group-V compound semiconductor layer
32*a* n-type emitter layer
4 n-side group-III-group-V compound electrode layer
41 n-side window layer
42 n-side contact layer
4*a* first surface
4*b* second surface
44 sacrifice layer
45 substrate
5 chamber
6 aqueous solution
7 inert gas
71 anode electrode
72 reference electrode
81 Zn layer
82 ZnO crystalline layer
83 obverse electrode
84 reverse electrode
85 isolation film
86 opening
861 second mask 87 obverse electrode wiring part
88 reverse electrode wiring part
9 supporting substrate
93 ZnO transparent electrode layer
101 solar cell element
102 condenser lens
103 cold plate
104 anti-reflection coating
105 spacer
110 solar cell

The invention claimed is:

1. A method for fabricating a solar cell element, the method comprising:
a step (a) of preparing a laminate and a chamber, wherein:
the laminate comprises a p-side group-III-group-V compound electrode layer, a p-type group-III-group-V compound semiconductor layer, an n-type group-III-group-V compound semiconductor layer, and an n-side group-III-group-V compound electrode layer,
the n-side group-III-group-V compound electrode layer comprises a first surface and a second surface,
the p-type group-III-group-V compound semiconductor layer is interposed between the p-side group-III-group-V compound electrode layer and the n-type group-III-group-V compound semiconductor layer,
the n-type group-III-group-V compound semiconductor layer is interposed between the p-type group-III-group-V compound semiconductor layer and the first surface,
the second surface is exposed on the surface of the laminate, and
the chamber has an aqueous solution and an inert gas;
a step (b) of bringing the laminate into contact with the aqueous solution in such a manner that the second surface is immersed in the aqueous solution after the step (a);
a step (c) of applying a voltage difference between an anode electrode and the laminate under an atmosphere of the inert gas to form a Zn layer on the second surface after the step (b), wherein:
the chamber is filled with the inert gas,
the aqueous solution contains $Zn^{2+}$ ions having a concentration of not less than 1 mM and not more than 5 M,
no oxygen gas is dissolved in the aqueous solution,
the anode electrode is contact with the aqueous solution,
the laminate is used as a cathode electrode,
a temperature of the aqueous solution is not less than 10 degrees Celsius and not more than 60 degrees Celsius, and
the Zn layer has a concave-convex structure on the surface thereof; and
a step (d) of exposing the Zn layer to oxygen so as to convert the Zn layer into a ZnO crystalline layer after the step (c).

2. The method according to the claim 1, wherein in the step (d), the Zn layer is exposed to air.

3. The method according to the claim 1, wherein:
in the step (a), the n-side group-III-group-V compound electrode layer comprises a GaAs layer, and
a surface of the GaAs layer is the second surface.

4. A method comprising a step of electrodepositing a Zn layer on an electrode by using an aqueous solution containing $Zn^{2+}$, wherein:
no oxygen gas is dissolved in the aqueous solution, and
the electrode comprises a III-V semiconductor.

5. The method of claim 4, wherein the step of electrodepositing is performed in a chamber that contains the aqueous solution and is filled with an inert gas.

6. The method of claim 4, wherein a temperature of the aqueous solution is not less than 10 degrees Celsius and not more than 60 degrees Celsius.

7. The method of claim 4, wherein a concentration of $Zn^{2+}$ ions in the aqueous solution is not less than 1 mM and not more than 5 M.

8. The method of claim 4, wherein the II-V semiconductor comprises GaAs.

* * * * *